US006245603B1

(12) United States Patent
Shinohara

(10) Patent No.: US 6,245,603 B1
(45) Date of Patent: Jun. 12, 2001

(54) MANUFACTURING METHOD FOR SEMICONDUCTOR DEVICE

(75) Inventor: Hirofumi Shinohara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/498,069

(22) Filed: Feb. 4, 2000

(30) Foreign Application Priority Data

Feb. 10, 1999 (JP) .................................... 11-032784

(51) Int. Cl.[7] .................................... H01L 21/336

(52) U.S. Cl. ............................ 438/197; 438/527

(58) Field of Search .................... 438/197, 206, 438/268, 273, 285, 405, 142, 586, 589, 519, 527

(56) References Cited

U.S. PATENT DOCUMENTS 4,985,745 * 1/1991 Kitahara et al. ..................... 357/49
6,117,735 * 9/2000 Ueno ................................... 438/268

* cited by examiner

Primary Examiner—David Nelms
Assistant Examiner—David Nhu
(74) Attorney, Agent, or Firm—Rabin & Champagne, P.C.

(57) ABSTRACT

A manufacturing method for a semiconductor device permits a MOSFET with a pocket layer to be securely formed even when microminiaturization makes it difficult to implant impurity ions at an angle with respect to a silicon substrate in manufacturing a semiconductor, a MOSFET having a pocket layer in particular. A gate electrode composed of a gate oxide film, a poly-silicon, and a tungsten silicide, and a nitride film pattern are selectively formed on a p-type silicon substrate, then p-type impurity ions are implanted perpendicularly to the p-type silicon substrate. A p-type ion implantation region formed by implanting the p-type impurity ions is diffused for activation to thereby form a pocket layer before another ion implantation region is formed.

5 Claims, 8 Drawing Sheets

MANUFACTURING METHOD FOR SEMICONDUCTOR DEVICE

BACKGROUND OF THE INVENTION

1. Field of the Invention

The present invention relates to a manufacturing method for a semiconductor device and, more particularly, to a MOSFET employing a pocket layer.

2. Description of Related Art

A metal oxide semiconductor field effect transistor (MOSFET) frequently employs a structure in which a region between a source-drain and a channel region has a lightly doped drain (LDD) layer that is an impurity layer of the same conductive type as the source-drain and of a low concentration and shallow junction in order to suppress short channel effect that poses a problem in reducing a gate length. However, when the gate length is 0.25 $\mu$m or less, it becomes difficult to suppress the short channel effect by the LDD structure alone. To overcome this difficulty, a structure employing a pocket layer is being used more frequently.

For producing the pocket layer, an impurity of a different conductive type from that of the source-drain must be supplied to a portion where a depletion layer extends under the channel region at the time of operation. For this purpose, ions are implanted aslant into a surface of a semiconductor substrate. After another ion implantation region, such as one that provides source-drain, is formed, the foregoing ion-implanted region is activated at the same time with another ion-implanted region to thereby form the pocket layer.

FIGS. 1 and 2 show sectional process views indicating a conventional process for forming a MOSFET. Referring to the sectional process views, the following will provide a brief explanation of a conventional process for forming a MOSFET having a pocket layer.

First, as shown in FIG. 1A, an oxide film, a poly-silicon film, a tungsten silicide film, and a nitride film are formed in this order on a p-type silicon substrate 410. Then, the films of these four layers are subjected to patterning to selectively form a gate electrode 450 composed of a gate oxide film 411, a poly-silicon 412, and a tungsten silicide 413, and a nitride film pattern 440. In the next step, p-type impurity ions, e.g. $BF_2^+$ ions, are implanted into the p-type silicon substrate 410 at an angle with respect to the surface of the p-type silicon substrate 410 as indicated by arrows of FIG. 1A, using the nitride film pattern 414 and the gate electrode 450 as a mask, so as to form a p-type ion implantation region 420.

Then, as shown in FIG. 1B, n-type impurity ions, e.g. $As^+$ ions, are implanted into the p-type silicon substrate 410 perpendicularly to the surface of the p-type silicon substrate 410 as indicated by arrows of FIG. 1B, using the nitride film pattern 440 and the gate electrode 450 as a mask, so as to form an n-type ion implantation region 444. A dosage of the ions to be implanted is approximately one hundredth of a dosage of ions to be implanted for forming a source-drain layer 423a in FIG. 2A.

In the next step, as illustrated in FIG. 1C, a side wall spacer 441 composed of a nitride film is selectively formed on side walls of the gate electrode 450, the nitride film pattern 440, and the gate oxide film 411, then n-type impurity ions, e.g. $As^+$ ions, are implanted into the p-type silicon substrate 410 perpendicularly to the surface of the p-type silicon substrate 410, using the side wall spacer 441 and the nitride film pattern 440 as a mask, so as to form an n-type ion implantation region 423.

Subsequently, heat treatment is performed as shown in FIG. 2A to activate the ion implantation regions 420, 444, and 423 that have been formed so far in order to form a pocket layer 420a from the ion implantation region 420, an LDD layer 444a from the ion implantation region 444, and a source-drain layer 423a from the ion implantation region 423. Then, an insulative interlayer film 415 formed of $SiO_2$ or the like is formed over the entire surface, and a contact hole 430 is opened above the source-drain layer 423a.

Next, as illustrated in FIG. 2B, a contact layer 432 is embedded in the contact hole 430, and a wiring layer 431 is formed on the contact layer 432.

As described above, in the conventional process for forming a pocket layer, ions are implanted aslant with respect to the surface of the silicon substrate, the ion implantation region is formed in the portion where the depletion layer extends under the channel region at the time of operation, then the ion implantation regions are activated to thereby form the pocket layer.

However, when a design rule becomes, for example, 0.18 $\mu$m or less as microminiaturization advances, an interval between gate electrodes becomes smaller than a height of the gate electrodes. Therefore, implanting ions at an angle with respect to the surface of the silicon substrate causes a shadow effect to start to take place wherein impurity ions cannot be implanted in a shadow of an adjoining gate electrode. The shadow effect prevents the ion implantation region from being formed to cover the portion where the depletion layer spreads under the channel region during an operation. This means that the pocket layer cannot be formed. On the other hand, if a method is used wherein a time for diffusing the ion implantation layers after the formation of all the ion implantation regions is extended to form the pocket layer, then another ion implantation layer, e.g. the ion implantation layer to become the source-drain, excessively diffuses, resulting in deteriorated device characteristics.

SUMMARY OF THE INVENTION

An object of the present invention is to provide a manufacturing method for a semiconductor device that permits a pocket layer to be securely formed in a semiconductor device of 0.18 $\mu$m or less in which the short channel effect becomes further noticeable.

To this end, according to the present invention, there is provided a manufacturing method for a semiconductor device wherein a gate insulating film and a gate electrode located on the gate insulating film are selectively formed on a surface of a first conductive type semiconductor substrate. Then, an impurity of the first conductive type is introduced perpendicularly to the surface of the semiconductor substrate, using the gate electrode as a mask to thereby form an ion implantation region of the first conductive type at a predetermined depth in the semiconductor substrate. The ion implantation region is diffused so that it extends and lies directly below a channel region that corresponds to the gate electrode, thus activating the ion implantation region. Thereafter, using the gate electrode as a mask, an impurity of a second conductive type is introduced at a predetermined depth from the surface of the semiconductor substrate so as to form an ion implantation region of the second conductive type. Then, the ion implantation region is activated to form a source and a drain of the second conductive type.

DETAILED DESCRIPTION OF THE PREFERRED EMBODIMENTS

FIG. 3 and FIG. 4 are process sectional views illustrating a first embodiment of the manufacturing method for a semiconductor device in accordance with the present invention. The first embodiment of the present invention will now be described in conjunction with FIG. 3 and FIG. 4.

The description will be given of a case where an n-type metal oxide semiconductor field effect transistor (NMOSFET) is fabricated using the first embodiment of the present invention.

Figure 1A:
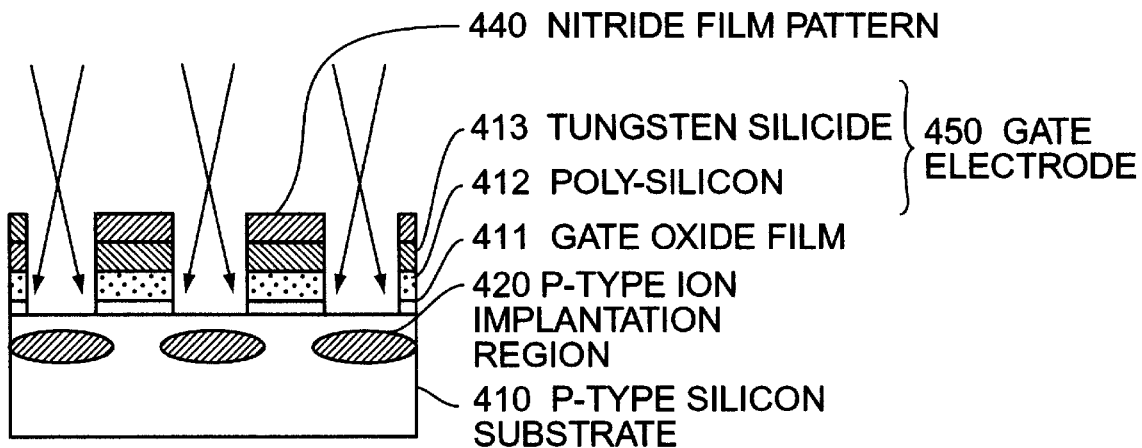
FIGS. 1a, 1b and 1c show sectional views illustrative of a first half of a conventional process.
Figure 1B:
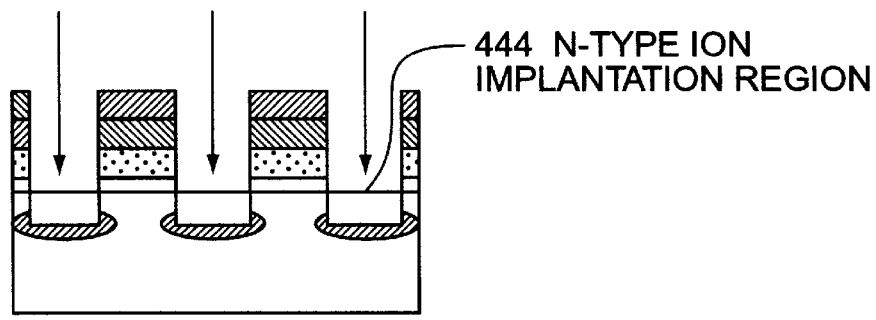
Figure 1C:
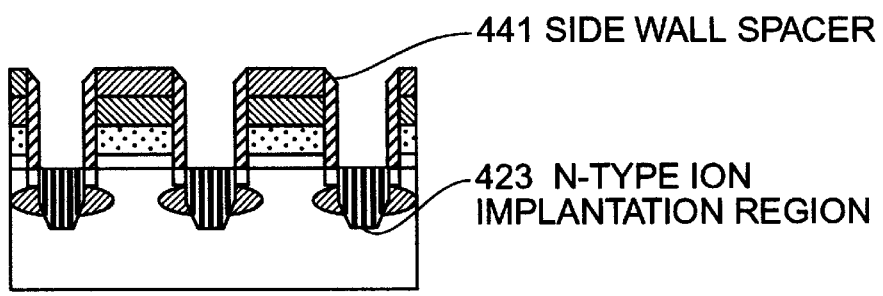
Figure 2A:
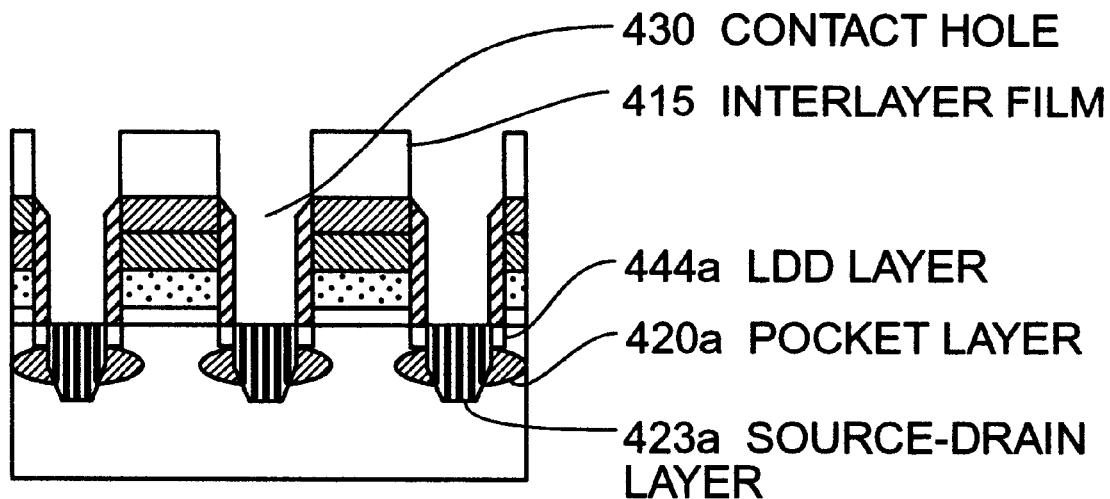
FIGS. 2a, and 2b show sectional views illustrative of a second half of the conventional process.
Figure 2B:
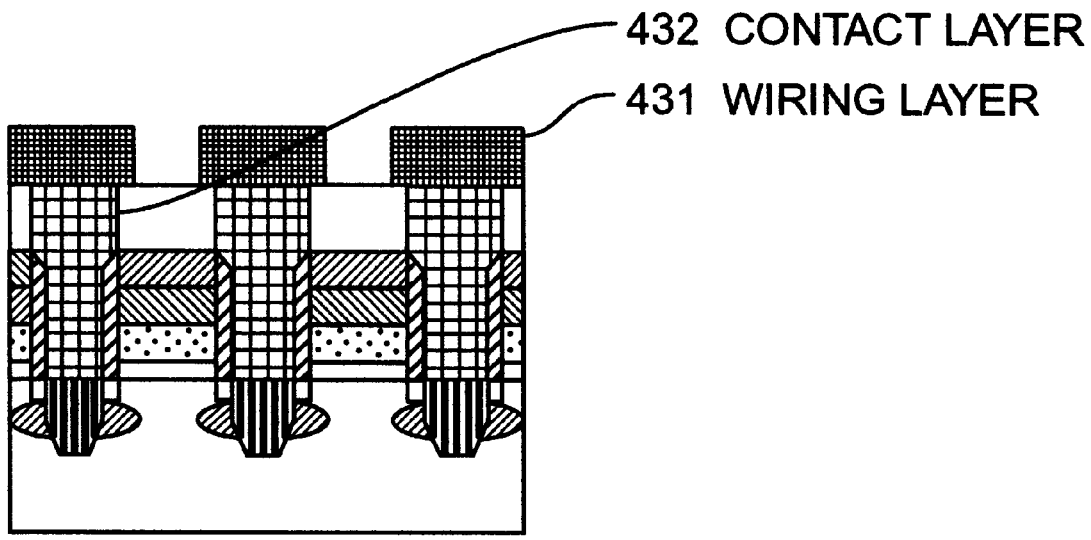
Figure 3A:
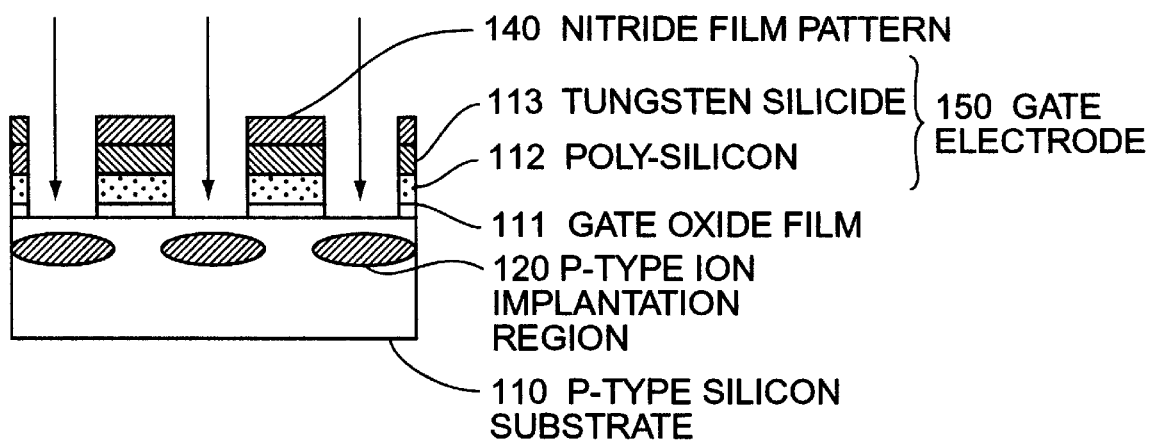
FIGS. 3a, 3b and 3c show sectional views illustrative of a first half of a process of a first embodiment in accordance with the present invention.

First, as shown in FIG. 3A, an oxide film, a poly-silicon film, a tungsten silicide film, and a nitride film are formed in this order on a p-type silicon substrate 110. Then, the films of these four layers are subjected to patterning to selectively form a gate electrode 150 formed of a gate oxide film 111, a poly-silicon 112, and a tungsten silicide 113, and a nitride film pattern 140.

In the next step, p-type impurity ions are implanted into the p-type silicon substrate 110 perpendicularly to the surface of the p-type silicon substrate 110 as indicated by arrows of FIG. 3A, using the nitride film pattern 140 and the gate electrode 150 as a mask, so as to form a p-type ion implantation region 120. Parameters and conditions of the process of FIG. 3A are as follows: the type of the impurity ions to be implanted is $BF_2^+$; ion implantation energy is about 30 keV; implantation depth from the surface of the p-type silicon substrate 110 ranges from 0.07 $\mu$m to 0.10 $\mu$m; and the dosage is about $10^{13}/cm^2$.

Figure 3B:
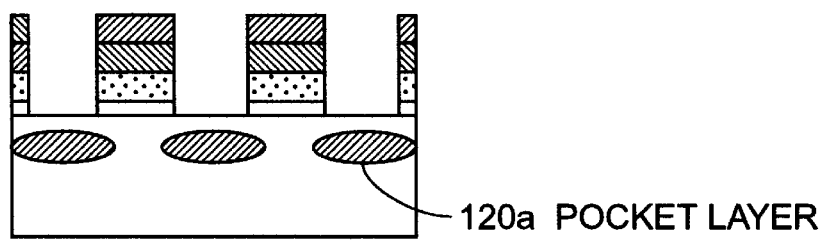

Then, as shown in FIG. 3B, the p-type ion implantation region 120 is subjected to heat treatment at 800° C. to 850° C. for 60 to 90 minutes to thermally diffuse the region 120 to a portion wherein a depletion layer extends under a channel region at the time of operation. The heat treatment diffuses and activates the p-type ion implantation region 120 to turn it into a pocket layer 120a.

Figure 3C:
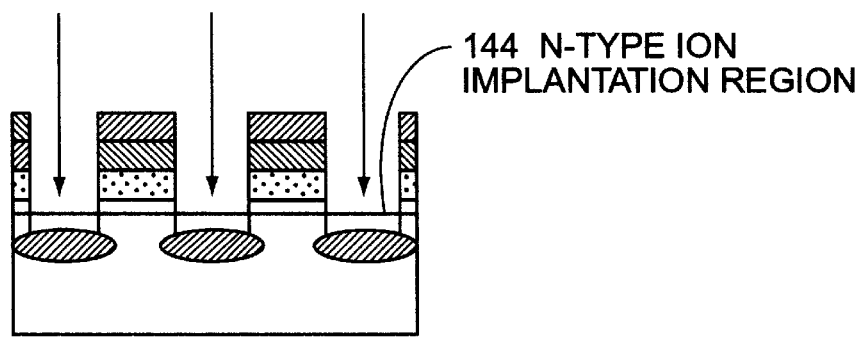

In the next step, n-type impurity ions are implanted into the p-type silicon substrate 110 perpendicularly to the surface of the p-type silicon substrate 110 as indicated by arrows of FIG. 3C, using the nitride film pattern 114 and the gate electrode 150 as a mask, so as to form an n-type ion implantation region 144. Parameters and conditions of the process of FIG. 3C are as follows: the type of the impurity ions to be implanted is $As^+$; ion implantation energy ranges from about 20 keV to about 30 keV; implantation depth from the surface of the p-type silicon substrate ranges from about 0.04 $\mu$m to about 0.07 $\mu$m; and Dosage is about $2\times10^{13}/cm^2$ to about $5\times10^{13}/cm^2$.

Figure 4A:
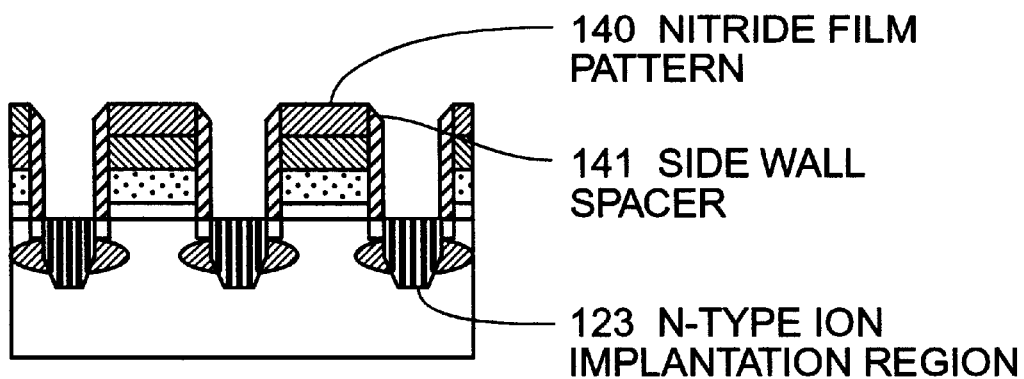
FIGS. 4a, 4b and 4c show sectional views illustrative of a second half of the process of the first embodiment in accordance with the present invention.

In the next step, as illustrated in FIG. 4A, a side wall spacer 141 composed of a nitride film is formed on side walls of the gate electrode 150, the nitride film pattern 140, and the gate oxide film 111.

Then, n-type impurity ions are implanted into the p-type silicon substrate 110 perpendicularly to the surface of the p-type silicon substrate 110, using the side wall spacer 141 and the nitride film pattern 140 as a mask, so as to form an n-type ion implantation region 123. Parameters and conditions of the process of FIG. 4A are as follows: the type of the impurity ions to be implanted is $As^+$; ion implantation energy is about 50 keV; implantation depth from the surface of the p-type silicon substrate 110 is about 0.1 $\mu$m; and the dosage is about $5\times10^{15}/cm^2$.

Figure 4B:
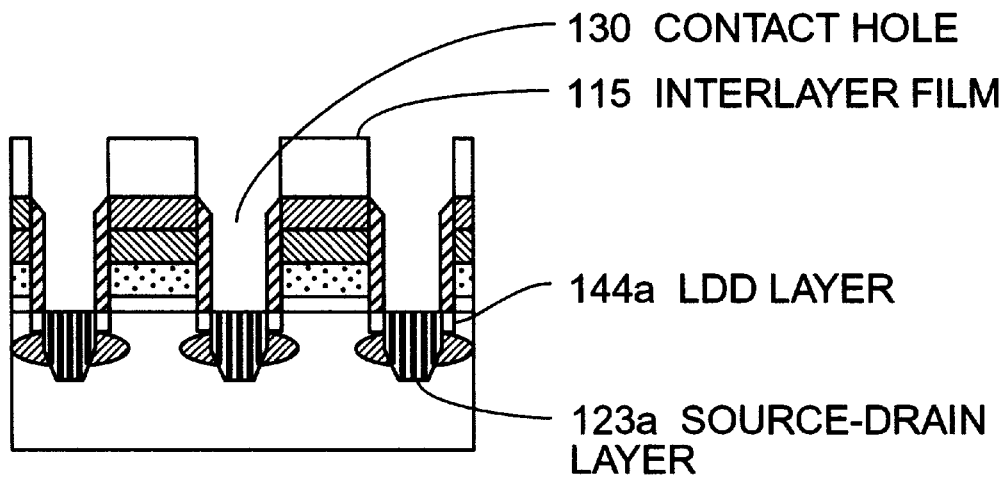

Subsequently, as shown in FIG. 4B, heat treatment is performed at about 1000° C. for about 10 seconds. The heat treatment activates the n-type ion implantation region 123 into a source-drain layer 123a, and also activates the n-type ion implantation region 144 into an LDD layer 144a. Then, an insulative interlayer film 115 formed of $SiO_2$ is deposited on the entire surface, and a contact hole 130 is opened above the source-drain layer 123a by carrying out a photolithography process and an etching process.

Figure 4C:
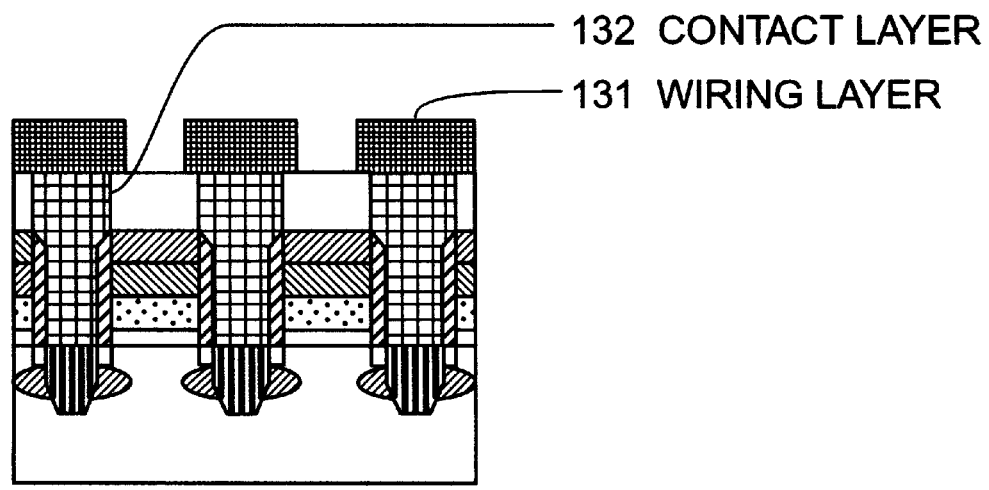

Next, as shown in FIG. 4C, a conductive layer is deposited on the entire surface to form a contact layer 132, and etch backing or chemical mechanical polishing (CMP) is performed to form the contact layer 132 in the contact hole 130. Lastly, a wiring layer 131 is deposited, and patterning is implemented by the photolithography process and the etching process. It is possible to use the contact layer 132 as the wiring layer.

The nitride film pattern 140 and the side wall spacer 141 function to prevent the gate electrode 150 from being exposed, the exposure being caused if a contact hole opening position is dislocated due to mask misalignment in the photolithography process when the contact hole 130 is opened above the source-drain layer 123a in FIG. 4B. If the contact layer 132 shown in FIG. 4C is formed in the contact hole 130 shown in FIG. 4B with the gate electrode 150 exposed, the contact layer 132 and the exposed gate electrode 150 electrically contact with each other, resulting in a short circuit. Hence, the problem caused by the foregoing misalignment can be solved by providing the nitride film pattern 140 on the gate electrode 150, and by providing the side wall spacer 141 on the side walls on the gate electrode 150, the nitride film pattern 140, and the gate oxide film 111.

As described above, according to the manufacturing method for a semiconductor device of the first embodiment in accordance with the present invention, the p-type ion implantation region 120 that turns into the pocket layer 120a is independently thermally diffused before the source-drain layer 123a is formed, so that the diffusing conditions of the p-type ion implantation region 120 that turns into the pocket layer can be set as desired without affecting the process for forming the source-drain layer 123a. In other words, the p-type ion implantation region 120 does not have to be directly formed by ion implantation in the portion where the depletion layer extends under the channel region at the time of operation. This enables the p-type impurity ions to be implanted perpendicularly to the surface of the p-type silicon substrate 110, so that the p-type impurity ions can be implanted without being blocked by the gate electrode 150.

Thus, even if the gate electrodes 150 are tall and the intervals between adjoining ones of the gate electrodes 150 are small, the pocket layer 120a can be formed in a portion wherein the depletion layer extends under the channel region during an operation, making it possible to satisfactorily suppress the short channel effect.

Furthermore, since the LDD layer 144a is formed after the pocket layer 120a has been formed, the LDD layer 144a can be formed without affecting the process for forming the pocket layer 120a. This is because the p-type ion implantation region 120 that provides the pocket layer 120a is independently thermally diffused before the ion implantation region 144 that turns into the LDD layer 144a is formed.

The NMOSFET has been taken as an example for describing the first embodiment of the present invention; however, the present invention may be used also for manufacturing a p-type metal oxide semiconductor field effect transistor (PMOSFET). When manufacturing the PMOSFET, an n-type silicon substrate is used in place of the p-type silicon substrate 110. Likewise, in the process of FIG. 3A, n-type impurity ions are implanted to form an n-type ion implantation region in place of the p-type impurity ions for forming the p-type ion implantation region 120. The parameters and conditions of the process of FIG. 3A are as follows: the type of the impurity ions to be implanted is $P^+$ or $As^+$; ion implantation energy is about 70 keV for $P^+$, or 150 keV for $As^+$; implantation depth from the surface of the n-type silicon substrate ranges from 0.07 $\mu$m to 0.10 $\mu$m; and the dosage is about $10^{13}/cm^2$.

Furthermore, in the process of FIG. 3C, p-type impurity ions are implanted to form a p-type ion implantation region instead of performing ion implantation for forming the n-type ion implantation region 144. The parameters and conditions of the process of FIG. 3C are as follows: the type of the impurity ions to be implanted is $BF_2^+$; ion implantation energy ranges from about 20 keV to about 30 keV; implantation depth from the surface of the n-type silicon substrate ranges from about 0.04 $\mu$m to about 0.07 $\mu$m; and the dosage ranges from about $2\times10^{13}/cm^2$ to about $5\times10^{13}/cm^2$.

In the process of FIG. 4A, p-type impurity ions are implanted to form a p-type ion implantation region instead of performing the ion implantation for forming the n-type ion implantation region 123. The parameters and conditions of the process of FIG. 4A are as follows: the type of the impurity ions to be implanted is $BF_2^+$; ion implantation energy is about 40 keV; implantation depth from the surface of the n-type silicon substrate is about 0.15 $\mu$m; and the dosage is about $3\times10^{15}/cm^2$.

The rest of the procedure is identical to the procedure for the NMOSFET.

The manufacturing method for a semiconductor device of this embodiment can be also applied to a case when a conductive substrate that is different from a semiconductor substrate is formed on a part of the semiconductor substrate, and a semiconductor device is formed on the surface of the substrate.

In this embodiment, the oxide film on the p-type silicon substrate 110 is patterned at the same time as the gate electrode 150 and the nitride film pattern 140 to form the gate oxide film 111; however, the method is not limited thereto. The gate oxide film 111 produced by patterning of the oxide film on the p-type silicon substrate 110 may be formed after the pocket layer 120a is formed or before the n-type ion implantation region 144 is formed.

Alternatively, an extension layer may be formed in place of the LDD layer 144a. In this case, the conditions of the impurity ion implantation are as follows: the type of the impurity ions to be implanted is $As^+$ for an NMOSFET or $BF_2^+$ for a PMOSFET; ion implantation energy ranges from about 5 keV to about 10 keV; implantation depth from the surface of the p-type silicon substrate ranges from about 0.03 $\mu$m to about 0.05 $\mu$m; and the dosage ranges from about $3\times10^{14}/cm^2$ to about $1\times10^{15}/cm^2$ for the NMOSFET or from about $1\times10^{14}/cm^2$ to about $5\times10^{14}/cm^2$ for the PMOSFET.

FIG. 5 and FIG. 6 are process sectional views illustrating a second embodiment of the manufacturing method for a semiconductor device in accordance with the present invention. The second embodiment of the present invention will now be described in conjunction with FIG. 5 and FIG. 6.

The description will be given of a case when an NMOSFET is fabricated using the second embodiment of the present invention.

Figure 5A:
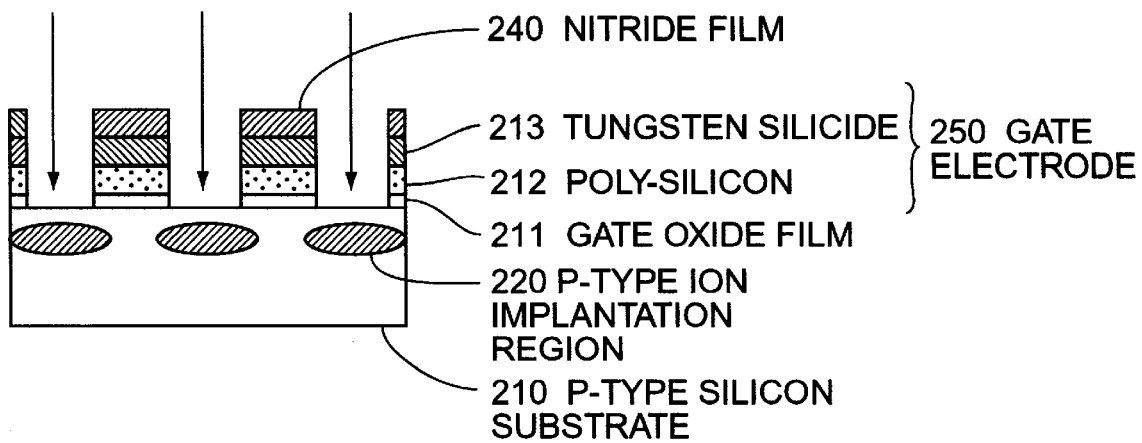
FIGS. 5a, 5b and 5c show sectional views illustrative of a first half of a process of a second embodiment in accordance with the present invention.

First, as shown in FIG. 5A, an oxide film, a poly-silicon film, a tungsten silicide film, and a nitride film are formed in this order on a p-type silicon substrate 210. Then, the films of these four layers are subjected to patterning to selectively form a gate electrode 250 formed of a gate oxide film 211, a poly-silicon 212, and a tungsten silicide 213, and a nitride film pattern 240.

In the next step, p-type impurity ions are implanted into the p-type silicon substrate 210 perpendicularly to the surface of the p-type silicon substrate 210 as indicated by arrows of FIG. 5A, using the nitride film pattern 240 and the gate electrode 250 as a mask, so as to form a p-type ion implantation region 220. Parameters and conditions of the process of FIG. 5A are as follows: the type of the impurity ions to be implanted is $BF_2^+$; ion implantation energy is about 30 keV; implantation depth from the surface of the p-type silicon substrate 210 ranges from 0.07 $\mu$m to 0.10 $\mu$m; and the dosage is about $10^{13}/cm^2$.

Figure 5B:

In the next step, as illustrated in FIG. 5B, an oxide film or other type of film 242 for preventing external diffusion is deposited to 0.03 $\mu$m to 0.04 $\mu$m at about 700° C. The film thickness of the film 242 for preventing external diffusion is set so that the p-type impurity ions included in the p-type ion implantation region 220 do not diffuse out of the p-type silicon substrate 210 during heat treatment.

Figure 5C:
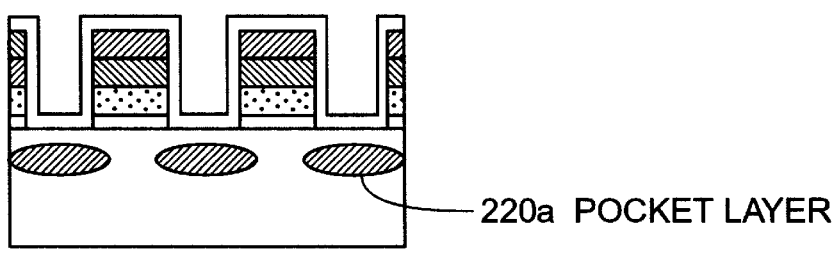

Then, as shown in FIG. 5C, the p-type ion implantation region 220 is subjected to heat treatment at 800° C. to 850° C. for 60 to 90 minutes to thermally diffuse the region 220 to a position where a depletion layer extends under a channel region at the time of operation. The heat treatment diffuses and activates the p-type ion implantation region 220 to turn it into a pocket layer 220a.

Figure 5D:
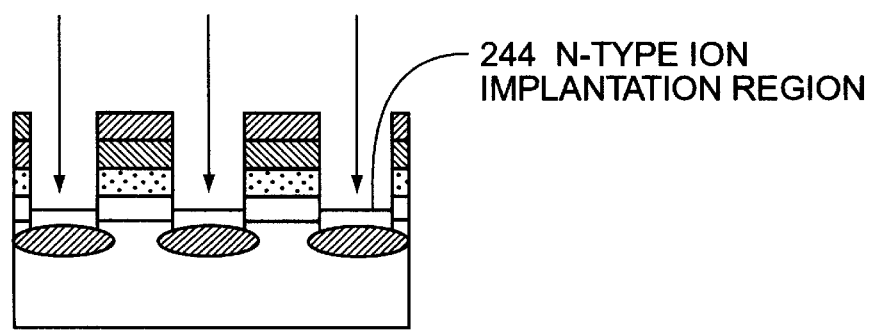

In the next step, as shown in FIG. 5D, the film 242 for preventing external diffusion is removed. Then, n-type impurity ions are implanted into the p-type silicon substrate 210 perpendicularly to the surface of the p-type silicon substrate 210 as indicated by arrows of FIG. 5D, using the nitride film pattern 214 and the gate electrode 250 as a mask, so as to form an n-type ion implantation region 244. Parameters and conditions of the process of FIG. 5D are as follows: the type of the impurity ions to be implanted is $As^+$; ion implantation energy ranges from about 20 keV to about 30 keV; implantation depth from the surface of the p-type silicon substrate ranges from about 0.04 $\mu$m to about 0.07 $\mu$m; and the dosage is about $2\times10^{13}/cm^2$ to about $5\times10^{13}/cm^2$.

Figure 6A:
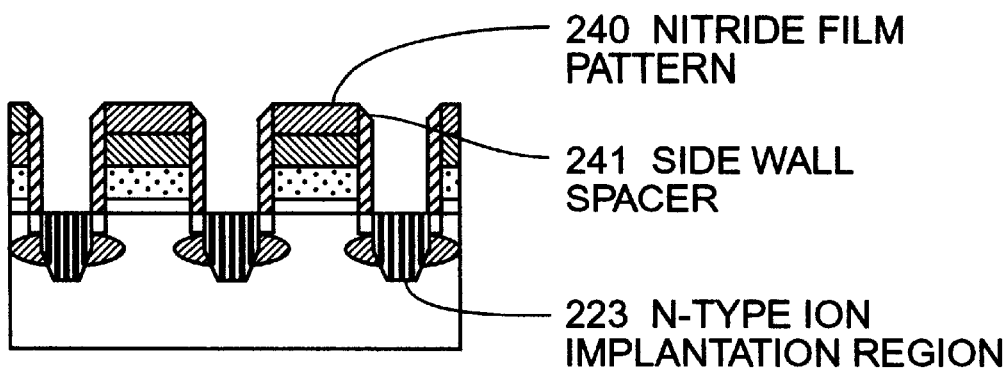
FIGS. 6a, 6b and 6c show sectional views illustrative of a second half of the process of the second embodiment in accordance with the present invention.

In the next step, as illustrated in FIG. 6A, a side wall spacer 241 composed of a nitride film is formed on side walls of the gate electrode 250, the nitride film pattern 240, and the gate oxide film 211.

Then, n-type impurity ions are implanted into the p-type silicon substrate 210 perpendicularly to the surface of the p-type silicon substrate 210, using the side wall spacer 241 and the nitride film pattern 240 as a mask, so as to form an n-type ion implantation region 223. Parameters and conditions of the process of FIG. 6A are as follows: the type of the impurity ions to be implanted is As$^+$; ion implantation energy is about 50 keV; implantation depth from the surface of the p-type silicon substrate 210 is about 0.1 µm; and the dosage is about $5\times10^{15}$/cm$^2$.

Figure 6B:
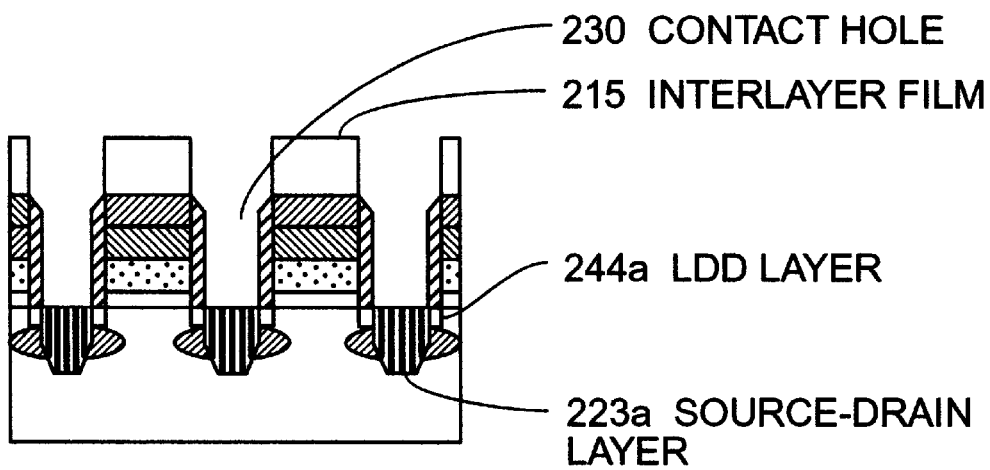

Subsequently, as shown in FIG. 6B, heat treatment is performed at about 1000° C. for about 10 seconds. The heat treatment activates the n-type ion implantation region 223 into a source-drain layer 223a, and also activates the n-type ion implantation region 244 into an LDD layer 244a. Then, an insulative interlayer film 215 formed of SiO$_2$ is deposited on the entire surface, and a contact hole 230 is opened above the source-drain layer 223a by carrying out a photolithography process and an etching process.

Figure 6C:
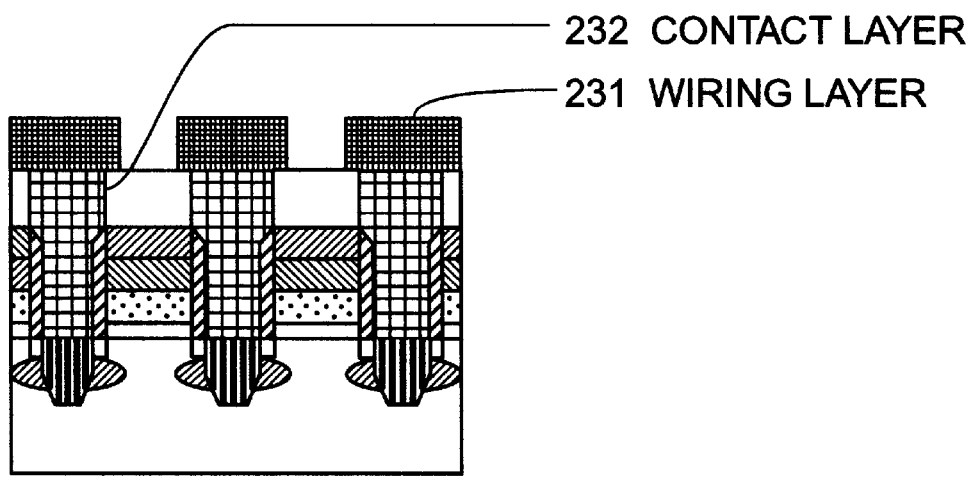

Next, as shown in FIG. 6C, a conductive layer is deposited on the entire surface to form a contact layer 232, and etch back or chemical mechanical polishing is performed to form the contact layer 232 in the contact hole 230. Lastly, a wiring layer 231 is deposited, and patterning is implemented by the photolithography process and the etching process. It is possible to use the contact layer 232 as the wiring layer.

The nitride film pattern 240 and the side wall spacer 241 function to prevent the gate electrode 250 from being exposed, the exposure being caused if a contact hole opening position is dislocated due to mask misalignment in the photolithography process when the contact hole 230 is opened above the source-drain layer 223a in FIG. 6B. If the contact layer 232 shown in FIG. 6C is formed in the contact hole 230 shown in FIG. 6B with the gate electrode 250 exposed, the contact layer 232 and the exposed gate electrode 250 electrically contact with each other, resulting in a short circuit. Hence, the problem caused by the foregoing misalignment can be solved by providing the nitride film pattern 240 on t he gate electrode 250, and by providing the side wall spacer 241 on the side walls on the gate electrode 250, the nitride film pattern 240, and the. gate oxide film 211.

As described above, according to the manufacturing method for a semiconductor device of the second embodiment in accordance with the present invention, the p-type ion implantation region 220 that turns into the pocket layer 220a is independently thermally diffused before the source-drain layer 223a is formed, so that the diffusing conditions of the p-type ion implantation region 220 that turns into the pocket layer can be set as desired without affecting the process for forming the source-drain layer 223a. In other words, the p-type ion implantation region 220 does not have to be directly formed by ion implantation in the portion where the depletion layer extends under the channel region at the time of operation. This enables the p-type impurity ions to be implanted perpendicularly to the surface of the p-type silicon substrate 210, so that the p-type impurity ions can be implanted without being blocked by the gate electrode 250. Thus, even if the gate electrodes 250 are tall and the intervals between adjoining ones of the gate electrodes 250 are small, the pocket layer 220a can be formed in a portion wherein the depletion layer extends under the channel region during an operation, making it possible to satisfactorily suppress the short channel effect.

Furthermore, since the LDD layer 244a is formed after the pocket layer 220a has been formed, the LDD layer 244a can be formed without affecting the process for forming the pocket layer 220a. This is because the p-type ion implantation region 220 that provides the pocket layer 220a is independently thermally diffused before the ion implantation region 244 that turns into the LDD layer 244a is formed.

Moreover, due to the step of depositing the film 242 for preventing external diffusion shown in FIG. 5B, impurity ions in the p-type ion implantation region 220 are blocked by the film 242 when the p-type ion implantation region 220 shown in FIG. 5C is activated by thermal diffusion to form the pocket layer 220a, thus preventing the impurity ions from diffusing out of the p-type silicon substrate 210.

The NMOSFET has been taken as an example for describing the second embodiment of the present invention; however, the present invention may be used also for manufacturing a PMOSFET. When manufacturing the PMOSFET, an n-type silicon substrate is used in place of the p-type silicon substrate 210. Likewise, in the process of FIG. 5A, n-type impurity ions are implanted to form an n-type ion implantation region in place of the p-type impurity ions for forming the p-type ion implantation region 220. The parameters and conditions of the process of FIG. 5A are as follows: the type of the impurity ions to be implanted is P$^+$ or As$^+$; ion implantation energy is about 70 keV for P$^+$, or 150 keV for As$^+$; implantation depth from the surface of the n-type silicon substrate ranges from 0.07 µm to 0.10 µm; and the dosage is about $10^{13}$/cm$^2$.

Furthermore, in the process of FIG. 5D, p-type impurity ions are implanted to form a p-type ion implantation region instead of performing ion implantation for forming the n-type ion implantation region 244. The parameters and conditions of the process of FIG. 5D are as follows: the type of the impurity ions to be implanted is BF$_2^+$; ion implantation energy ranges from about 20 keV to about 30 keV; implantation depth from the surface of the n-type silicon substrate ranges from about 0.04 µm to about 0.07 µm; and the dosage ranges from about $2\times10^{13}$/cm$^2$ to about $5\times10^{13}$/cm$^2$.

In the process of FIG. 6A, p-type impurity ions are implanted to form a p-type ion implantation region instead of performing the ion implantation for forming the n-type ion implantation region 223. The parameters and conditions of the process of FIG. 6A are as follows: the type of the impurity ions to be implanted is BF$_2^+$; ion implantation energy is about 40 keV; implantation depth from the surface of the n-type silicon substrate is about 0.15 µm; and the dosage is about $3\times10^{15}$/cm$^2$.

The rest of the procedure is identical to the procedure for the NMOSFET.

The manufacturing method for a semiconductor device of this embodiment can be also applied to a case when a conductive substrate that is different from a semiconductor substrate is formed on a part of the semiconductor substrate, and a semiconductor device is formed on the surface of the substrate.

In this embodiment, the oxide film on the p-type silicon substrate 210 is patterned at the same time as the gate electrode 250 and the nitride film pattern 240 to form the gate oxide film 211; however, the method is not limited thereto. The gate oxide film 211 produced by patterning of the oxide film on the p-type silicon substrate 210 may be formed when the film 242 for preventing external diffusion is removed.

Alternatively, an extension layer may be formed in place of the LDD layer 244a. In this case, the conditions of the impurity ion implantation are as follows: the type of the impurity ions to be implanted is As⁺ for an NMOSFET or BF$_2^+$ for a PMOSFET; ion implantation energy ranges from about 5 keV to about 10 keV; implantation depth from the surface of the p-type silicon substrate ranges from about 0.03 μm to about 0.05 μm; and the dosage ranges from about $3 \times 10^{14}/cm^2$ to about $1 \times 10^{15}/cm^2$ for the NMOSFET or from about $1 \times 10^{14}/cm^2$ to about $5 \times 10^{14}/cm^2$ for the PMOSFET.

FIG. 7 and FIG. 8 are process sectional views illustrating a third embodiment of the manufacturing method for a semiconductor device in accordance with the present invention. The third embodiment of the present invention will now be described in conjunction with FIG. 7 and FIG. 8.

The description will be given of a case where an NMOSFET is fabricated using the third embodiment of the present invention.

Figure 7A:
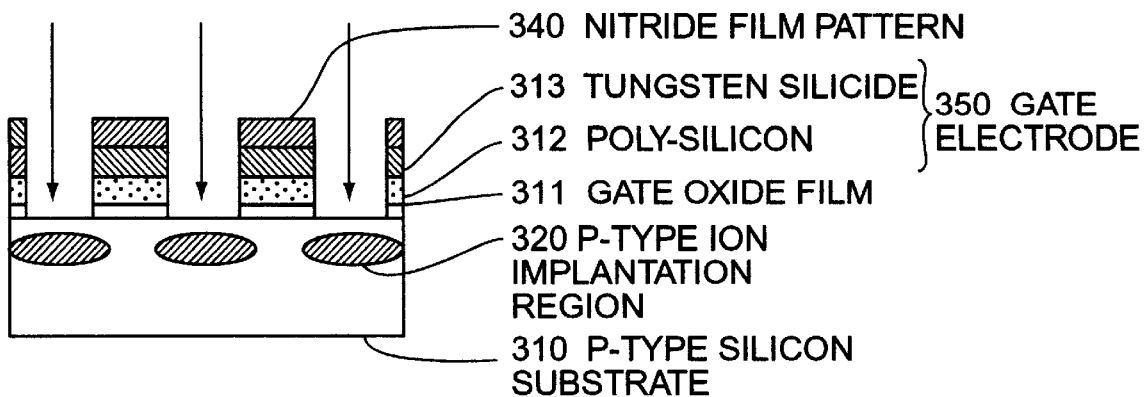
FIGS. 7a, 7b and 7c show sectional views illustrative of a first half of a process of a third embodiment in accordance with the present invention.

First, as shown in FIG. 7A, an oxide film, a poly-silicon film, a tungsten silicide film, and a nitride film are formed in this order on a p-type silicon substrate 310. Then, the films of these four layers are subjected to patterning to selectively form a gate electrode 350 formed of a gate oxide film 311, a poly-silicon 312, and a tungsten silicide 313, and a nitride film pattern 340.

In the next step, p-type impurity ions are implanted into the p-type silicon substrate 310 perpendicularly to the surface of the p-type silicon substrate 310 as indicated by arrows of FIG. 7A, using the nitride film pattern 340 and the gate electrode 350 as a mask, so as to form a p-type ion implantation region 320. Parameters and conditions of the process of FIG. 7A are as follows: the type of the impurity ions to be implanted is BF$_2^+$; ion implantation energy is about 30 keV; implantation depth from the surface of the p-type silicon substrate 310 ranges from 0.07 μm to 0.10 μm; and the dosage is about $10^{13}/cm^2$.

Figure 7B:
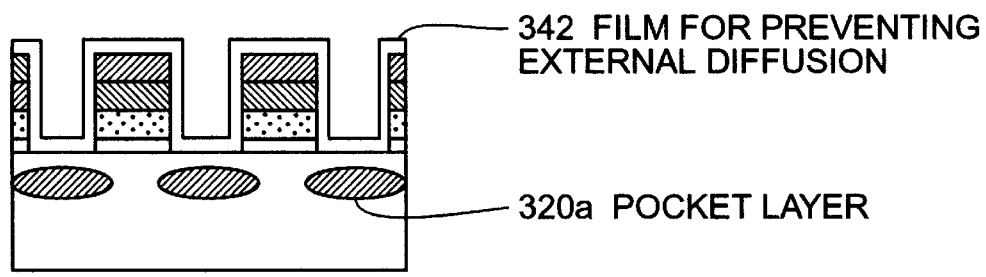

Subsequently, as shown in FIG. 7B, heat treatment is performed at a temperature, e.g. 700° C., at which the p-type impurity ions contained in the p-type ion implantation region 320 do not diffuse out of the p-type silicon substrate 310, in an oxygen atmosphere, then the temperature is raised to 800° C. to 850° C. to activate the p-type ion implantation region 320 by diffusion so as to form the pocket layer 320a. At this time, a film 342 made of, for example, a SiO$_2$ film, for preventing external diffusion is also formed. In other words, in the step shown in FIG. 7B, the prevention of external diffusion of the p-type impurity ions contained in the p-type ion implantation region 320 and the formation of the pocket layer 320a are performed in succession.

Figure 7C:
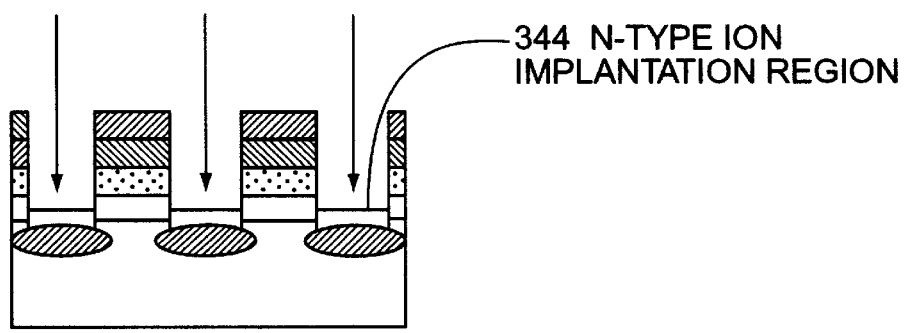

Next, as illustrated in FIG. 7C, the film 342 for preventing external diffusion is removed. Then, n-type impurity ions are implanted into the p-type silicon substrate 310 perpendicularly to the surface of the p-type silicon substrate 310 as indicated by arrows of FIG. 7C, using the nitride film pattern 340 and the gate electrode 350 as a mask, so as to form an n-type ion implantation region 344. Parameters and conditions of the process of FIG. 7C are as follows: the type of the impurity ions to be implanted is As⁺; ion implantation energy ranges from about 20 keV to about 30 keV; implantation depth from the surface of the p-type silicon substrate ranges from about 0.04 μm to about 0.07 μm; and the dosage is about $2 \times 10^{13}/cm^2$ to about $5 \times 10^{13}/cm^2$.

Figure 8A:
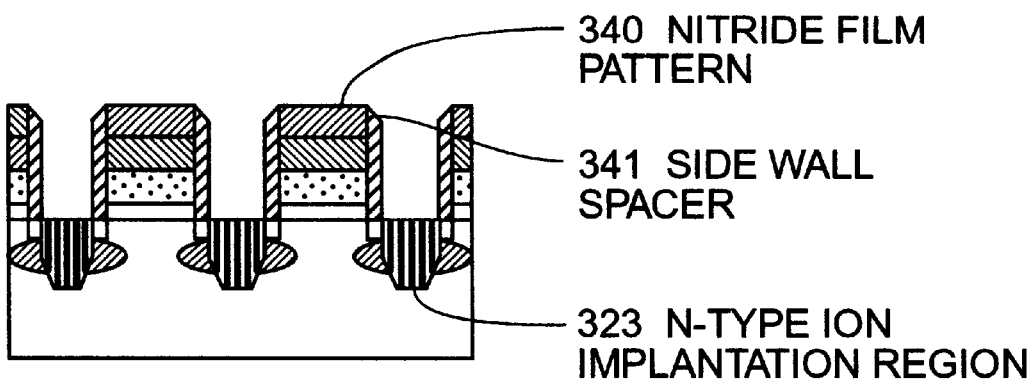
FIGS. 8a, 8b and 8c show sectional views illustrative of a second half of the process of the third embodiment in accordance with the present invention.

In the next step, as illustrated in FIG. 8A, a side wall spacer 341 composed of a nitride film is formed on side walls of the gate electrode 350, the nitride film pattern 340, and the gate oxide film 311.

Then, n-type impurity ions are implanted into the p-type silicon substrate 310 perpendicularly to the surface of the p-type silicon substrate 310, using the side wall spacer 341 and the nitride film pattern 340 as a mask, so as to form an n-type ion implantation region 323. Parameters and conditions of the process of FIG. 8A are as follows: the type of the impurity ions to be implanted is As⁺; ion implantation energy is about 50 keV; implantation depth from the surface of the p-type silicon substrate 310 is about 0.1 μm; and the dosage is about $5 \times 10^{15}/cm^2$.

Figure 8B:
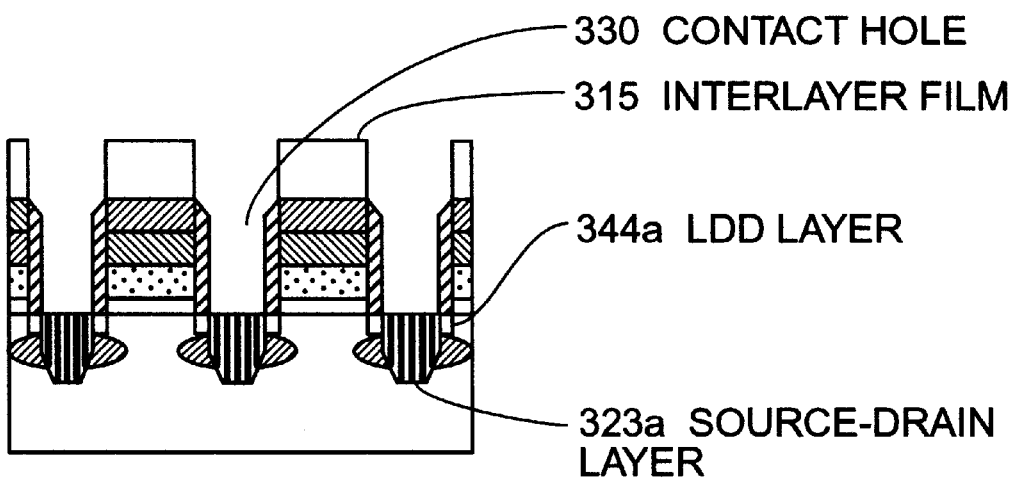

Subsequently, as shown in FIG. 8B, heat treatment is performed at about 1000° C. for about 10 seconds. The heat treatment activates the n-type ion implantation region 323 into a source-drain layer 323a, and also activates the n-type ion implantation region 344 into an TDD layer 344a. Then, an insulative interlayer film 315 formed of SiO$_2$ is deposited on the entire surface, and a contact hole 330 is opened above the source-drain layer 323a by carrying out a photolithography process and an etching process.

Figure 8C:
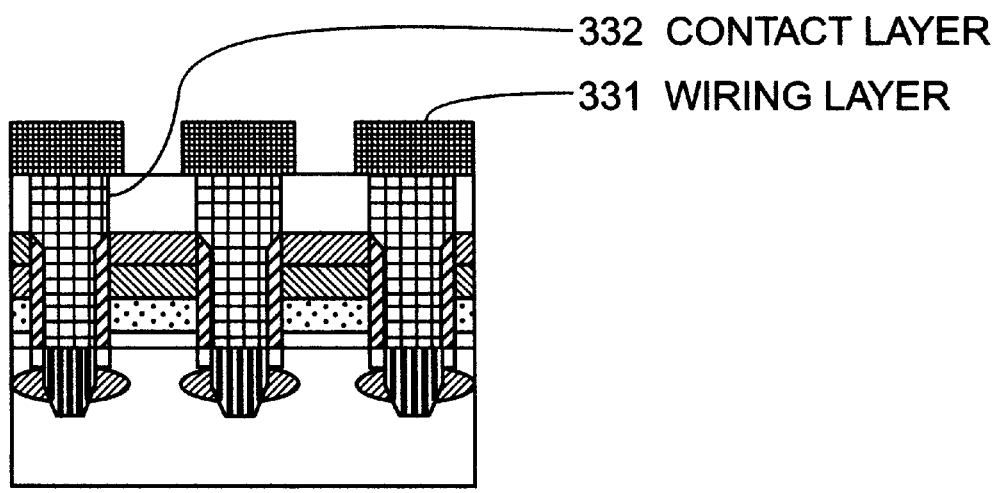

Next, as shown in FIG. 8C, a conductive layer is deposited on the entire surface to form a contact layer 332, and etch back or chemical mechanical polishing is performed to form the contact layer 332 in the contact hole 330. Lastly, a wiring layer 331 is deposited, and patterning is implemented by the photolithography process and the etching process. It is possible to use the contact layer 332 as the wiring layer.

The nitride film pattern 340 and the side wall spacer 341 function to prevent the gate electrode 350 from being exposed, the exposure being caused if a contact hole opening position is dislocated due to mask misalignment in the photolithography process when the contact hole 330 is opened above the source-drain layer 323a in FIG. 8B. If the contact layer 332 shown in FIG. 8C is formed in the contact hole 330 shown in FIG. 8B with the gate electrode 350 exposed, the contact layer 332 and the exposed gate electrode 350 electrically contact with each other, resulting in a short circuit. Hence, the problem caused by the foregoing misalignment can be solved by providing the nitride film pattern 340 on the gate electrode 350, and by providing the side wall spacer 341 on the side walls on the gate electrode 350, the nitride film pattern 340, and the gate oxide film 311.

As described above, according to the manufacturing method for a semiconductor device of the third embodiment in accordance with the present invention, the p-type ion implantation region 320 that turns into the pocket layer 320a is independently thermally diffused before the source-drain layer 323a is formed, so that the diffusing conditions of the p-type ion implantation region 320 that turns into the pocket layer can be set as desired without affecting the process for forming the source-drain layer 323a. In other words, the p-type ion implantation region 320 does not have to be directly formed by ion implantation in the portion where the depletion layer extends under the channel region at the time of operation. This enables the p-type impurity ions to be implanted perpendicularly to the surface of the p-type silicon substrate 310, so that the p-type impurity ions can be implanted without being blocked by the gate electrode 350. Thus, even if the gate electrodes 350 are tall and the intervals between adjoining ones of the gate electrodes 350 are small, the pocket layer 320a can be formed in a portion wherein the depletion layer extends under the channel region during an operation, making it possible to satisfactorily suppress the short channel effect.

Furthermore, since the LDD layer 344a is formed after the pocket layer 320a has been formed, the LDD layer 344a can be formed without affecting the process for forming the pocket layer 320a. This is because the p-type ion implantation region 320 that provides the pocket layer 320a is independently thermally diffused before the ion implantation region 344 that turns into the LDD layer 344a is formed.

Moreover, due to the step of depositing the film 342 for preventing external diffusion shown in FIG. 7B, impurity ions in the p-type ion implantation region 320 are blocked by the film 342 when the p-type ion implantation region 320 is activated by thermal diffusion to form the pocket layer 320a, thus preventing the impurity ions from diffusing out of the p-type silicon substrate 310. Furthermore, the film 342 for preventing the impurity ions in the p-type ion implantation region 320 from diffusing out and the pocket layer 320a are formed in succession. This permits the process for forming the MOSFET to be made simpler than that in the second embodiment in accordance with the present invention.

The NMOSFET has been taken as an example for describing the third embodiment of the present invention; however, the present invention may be used also for manufacturing a PMOSFET. When manufacturing the PMOSFET, an n-type silicon substrate is used in place of the p-type silicon substrate 310. Likewise, in the process of FIG. 7A, n-type impurity ions are implanted to form an n-type ion implantation region in place of the p-type impurity ions for forming the p-type ion implantation region 320. The parameters and conditions of the process of FIG. 7A are as follows: the type of the impurity ions to be implanted is $P^+$ or $As^+$; ion implantation energy is about 70 keV for $P^+$, or 150 keV for $As^+$; implantation depth from the surface of the n-type silicon substrate ranges from 0.07 μm to 0.10 μm; and the dosage is about $10^{13}/cm^2$.

Furthermore, in the process of FIG. 7C, p-type impurity ions are implanted to form a p-type ion implantation region instead of performing ion implantation for forming the n-type ion implantation region 344. The parameters and conditions of the process of FIG. 7C are as follows: the type of the impurity ions to be implanted is $BF_2^+$; ion implantation energy ranges from about 20 keV to about 30 keV; implantation depth from the surface of the n-type silicon substrate ranges from about 0.04 μm to about 0.07 μm; and the dosage ranges from about $2\times10^{13}/cm^2$ to about $5\times10^{13}/cm^2$.

In the process of FIG. 8A, p-type impurity ions are implanted to form a p-type ion implantation region instead of performing the ion implantation for forming the n-type ion implantation region 323. The parameters and conditions of the process of FIG. 8A are as follows: the type of the impurity ions to be implanted is $BF_2^+$; ion implantation energy is about 40 keV; implantation depth from the surface of the n-type silicon substrate is about 0.15 μm; and the dosage is about $3\times10^{15}/cm^2$.

The rest of the procedure is identical to the procedure for the NMOSFET.

The manufacturing method for a semiconductor device of this embodiment can be also applied to a case where a conductive substrate that is different from a semiconductor substrate is formed on a part of the semiconductor substrate, and a semiconductor device is formed on the surface of the substrate.

In this embodiment, the oxide film on the p-type silicon substrate 310 is patterned at the same time as the gate electrode 350 and the nitride film pattern 340 to form the gate oxide film 311; however, the method is not limited thereto. The gate oxide film 311 produced by patterning of the oxide film on the p-type silicon substrate 310 may be formed when the film 342 for preventing external diffusion is removed.

Alternatively, an extension layer may be formed in place of the LDD layer 344a. In this case, the conditions of the impurity ion implantation are as follows: the type of the impurity ions to be implanted is $As^+$ for an NMOSFET or $BF_2^+$ for a PMOSFET; ion implantation energy ranges from about 5 keV to about 10 keV; implantation depth from the surface of the p-type silicon substrate ranges from about 0.03 μm to about 0.05 μm; and the dosage ranges from about $3\times10^{14}/cm^2$ to about $1\times10^{15}/cm^2$ for the NMOSFET or from about $1\times10^{14}/cm^2$ to about $5\times10^{14}/cm^2$ for the PMOSFET.

As described above, using the embodiments in accordance with the present invention permits a pocket layer to be securely formed in a semiconductor device of a generation having a design rule of 0.18 μm or less at which forming the pocket layer by implanting ions aslant becomes difficult in forming a MOSFET.

What is claimed is:

1. A manufacturing method for a semiconductor device, comprising:

forming a gate electrode on a semiconductor substrate;

implanting an impurity of the first conductive type at a predetermined depth from the surface of the semiconductor substrate, using the gate electrode as a mask;

diffusing the impurity of the first conductive type to a predetermined portion of a channel region under the gate electrode;

implanting an impurity of a second conductive type in the semiconductor substrate, using the gate electrode as a mask; and diffusing the impurity of the second conductive type after introducing the impurity of the second conductive type to thereby form a source and a drain of the second conductive type.

2. A manufacturing method for a semiconductor device according to claim 1, further comprising, after said implanting an impurity of the first conductive type and before said diffusing the impurity of the first conductive type, forming a film for preventing external diffusion that covers an exposed surface of the semiconductor substrate into which the impurity of the first conductive type has been implanted.

3. A manufacturing method for a semiconductor device according to claim 2, wherein said forming the gate electrode on the semiconductor substrate is performed by raising a temperature to a point at which the impurity of the first conductive type thermally diffuses after the film grows to a thickness that makes it possible to prevent the impurity of the first conductive type from diffusing out.

4. A manufacturing method for a semiconductor device according to claim 1, further comprising, after diffusing the impurity of the first conductive type to a predetermined portion of the channel region, forming an impurity region that is of the same conductive type as the source and has a lower concentration than that of the source in a region between the source or the drain and the channel region.

5. A method of manufacturing a semiconductor device, comprising:

forming a gate electrode on a semiconductor substrate;

implanting impurity ions of a first conductivity type in the semiconductor substrate using the gate electrode as a mask;

heating the semiconductor substrate to diffuse the impurity ions of the first conductivity type under the gate electrode;

implanting impurity ions of a second conductivity type in the semiconductor substrate after the impurity ions of the first conductivity type are diffused, using the gate electrode as a mask; and heating the semiconductor substrate to diffuse the impurity ions of the second conductivity type to form source and drain regions.

* * * * *